(12) United States Patent
Honya et al.

(10) Patent No.: US 7,280,069 B2
(45) Date of Patent: Oct. 9, 2007

(54) RANGE-FINDING RADAR APPARATUS WITH HIGH-RESOLUTION PULSE-WIDTH CALCULATION UNIT

(75) Inventors: Tomohiro Honya, Tokyo (JP); Katsuhiko Tomita, Tokyo (JP); Hiroshi Ikeda, Tokyo (JP)

(73) Assignee: TDK Corporation, Tokyo (JP)

( * ) Notice: Subject to any disclaimer, the term of this patent is extended or adjusted under 35 U.S.C. 154(b) by 385 days.

(21) Appl. No.: 11/016,973

(22) Filed: Dec. 21, 2004

(65) Prior Publication Data
US 2005/0134498 A1     Jun. 23, 2005

(30) Foreign Application Priority Data
Dec. 22, 2003    (JP) .............................. 2003-424518

(51) Int. Cl.
*G01S 13/08* (2006.01)
(52) U.S. Cl. ....................... 342/135; 342/134
(58) Field of Classification Search ................ 342/118, 342/134–135, 128, 133, 139, 146
See application file for complete search history.

(56) References Cited

U.S. PATENT DOCUMENTS

| | | | | |
|---|---|---|---|---|
| 3,264,454 A | * | 8/1966 | Davis et al. ................... | 377/20 |
| 3,666,367 A | * | 5/1972 | Farnsworth et al. ........ | 356/5.08 |
| 4,150,375 A | * | 4/1979 | Ross et al. ..................... | 342/21 |
| 4,153,366 A | * | 5/1979 | Mamon et al. ............ | 356/5.03 |
| 4,620,788 A | * | 11/1986 | Giger ........................ | 356/5.13 |
| 5,102,219 A | * | 4/1992 | Skagerlund ................ | 356/5.08 |
| 5,574,552 A | * | 11/1996 | Dunne ........................ | 356/5.05 |
| 5,612,779 A | * | 3/1997 | Dunne ........................ | 356/5.01 |
| 5,703,678 A | * | 12/1997 | Dunne ........................ | 356/5.05 |
| 5,745,442 A | * | 4/1998 | Herscher ..................... | 368/118 |
| 5,852,491 A | * | 12/1998 | Kato ........................... | 356/5.01 |
| 6,057,910 A | * | 5/2000 | Dunne ........................ | 356/5.05 |

(Continued)

FOREIGN PATENT DOCUMENTS

JP          62-043589           2/1987

(Continued)

OTHER PUBLICATIONS

English language abstract of JP 6-138230, May 1994.

(Continued)

*Primary Examiner*—Thomas H. Tarcza
*Assistant Examiner*—Shelley Chen
(74) *Attorney, Agent, or Firm*—Greenblum & Bernstein, P.L.C.

(57) ABSTRACT

A radar apparatus includes a modulation signal generating unit that generates a modulation signal based on an internal clock with a cycle Tc and generates a trigger signal in synchronization with the modulation signal, a carrier wave generating unit that generates a carrier wave, a modulation unit that generates and outputs a high frequency signal by modulating the carrier wave using the modulation signal, a modulation signal extracting unit that extracts the modulation signal from a component of the high frequency signal that has been transmitted via a transmission antenna, the component having been reflected by a measured object and received by a reception antenna, a detection signal generating unit that generates a detection signal, for measuring a distance to the measured object, based on the trigger signal and the extracted modulation signal, and a pulse width calculating unit that calculates a pulse width of the detection signal.

4 Claims, 8 Drawing Sheets

U.S. PATENT DOCUMENTS

| | | | |
|---|---|---|---|
| 6,133,992 A * | 10/2000 | Tanaka et al. | 356/5.07 |
| 6,137,438 A * | 10/2000 | McEwan | 342/134 |
| 6,226,077 B1 * | 5/2001 | Dunne | 356/5.1 |
| 6,445,444 B2 * | 9/2002 | Dunne | 356/5.08 |
| 6,587,187 B2 * | 7/2003 | Watanabe et al. | 356/5.01 |
| 6,657,704 B2 * | 12/2003 | Shirai et al. | 356/4.01 |
| 6,757,054 B2 * | 6/2004 | Watanabe et al. | 356/5.1 |
| 6,771,103 B2 * | 8/2004 | Watanabe et al. | 327/161 |
| 7,145,500 B2 * | 12/2006 | Ikeda et al. | 342/92 |
| 2001/0012104 A1 * | 8/2001 | Dunne | 356/5.1 |
| 2002/0093640 A1 * | 7/2002 | Watanabe et al. | 356/5.01 |
| 2002/0131035 A1 * | 9/2002 | Watanabe et al. | 356/5.1 |
| 2003/0197498 A1 * | 10/2003 | Watanabe et al. | 324/76.35 |

FOREIGN PATENT DOCUMENTS

| | | | |
|---|---|---|---|
| JP | 4-3373 U | | 1/1992 |
| JP | 5-249260 | | 9/1993 |
| JP | 6-138230 | | 5/1994 |
| JP | 06138230 A | * | 5/1994 |
| JP | 7-244154 | | 9/1995 |
| JP | 07244154 A | * | 9/1995 |
| JP | 07280940 A | * | 10/1995 |
| JP | 8-211165 | | 8/1996 |
| JP | 9-21873 | | 1/1997 |
| JP | 9-043366 | | 2/1997 |
| JP | 9-304533 | | 11/1997 |
| JP | 10-073681 | | 3/1998 |
| JP | 11038135 A | * | 2/1999 |
| JP | 2000-121726 | | 4/2000 |
| JP | 2000121726 A | * | 4/2000 |
| JP | 7-244154 | | 3/2005 |

OTHER PUBLICATIONS

English language abstract of JP 5-249260, Sep. 1993.
English language abstract of JP 9-21873, Jan. 1997.
English language abstract of JP 9-304533, Nov. 1997.
English language abstract of JP 8-211165, Aug. 1996.
English language Abstract of JP 7-244154, 2005.
English language Abstract of JP 2000-121726, 2000.
English language Abstract of JP 7-244154, 1995.
English language Abstract and partial translation of JP 62-043589.
English language Abstract and computer-generated translations of JP 10-073681.
English language Abstract and computer-generated translation of JP-043366.

* cited by examiner

RANGE-FINDING RADAR APPARATUS WITH HIGH-RESOLUTION PULSE-WIDTH CALCULATION UNIT

BACKGROUND OF THE INVENTION

1. Field of the Invention

The present invention relates to a radar apparatus that is installed inside a vehicle or the like, for example, and is constructed so as to be capable of detecting a distance to a measured object such as an obstacle.

2. Description of the Related Art

A radar apparatus disclosed in Japanese Laid-Open Patent Publication No. H07-244154 is one example of this kind of radar apparatus. As shown in FIG. 1 of the publication, the radar apparatus includes a trigger signal generating circuit, a transmitting means, a reflected signal receiving circuit, and a distance detecting circuit. Here, the reflected signal receiving circuit includes a PD (photodiode), a logarithmic amplifier circuit, an A/D converter, and a reflected waveform memory. In this radar apparatus, the trigger signal generating circuit supplies a transmission start signal to the transmitting means and a conversion start signal to the A/D converter. Next, the A/D converter starts A/D conversion from a point when the start signal is inputted from the trigger signal generating circuit. By doing so, the waveform of a reflected signal from a start of transmission by the transmitting means is stored at sampling intervals in temporal order as digital data in the reflected waveform memory. On the other hand, the distance detecting circuit detects rises in the waveform of the reflected signal stored in the reflected waveform memory and, based on the product of the number of pieces of digital data that have been stored and the sampling interval, finds the time from the start of recording for the waveform of the reflected signal (i.e., the start for A/D conversion by the A/D converter) until the detected rise, and detects the distance to the reflecting body from the calculated time and the speed of light.

By investigating the radar apparatus described above, the present inventors discovered the following problems. In the above radar apparatus, circuits such as the trigger signal generating circuit and the reflected signal receiving circuit are normally designed to operate in synchronization with an internal clock outputted by a crystal oscillator disposed inside the apparatus. This means that in the above radar apparatus, the timing of the start of recording of the waveform of the reflected signal by the A/D converter that starts A/D conversion based on the start signal and the sampling clock of the A/D converter are also thought to be synchronized with the internal clock. On the other hand, since the reflected signal is proportional to the distance to the reflecting object, the rising point of the waveform of the reflected signal is asynchronous with the sampling clock. For this reason, at such asynchronous part, a measurement error of up to one cycle of the sampling clock is always present. Since the resolution for the time from the start of recording of the waveform of the reflected signal to the rise is around one cycle of the sampling clock, the resolution for the distance to the reflecting object is the product of one cycle of the sampling clock and the speed of light, resulting in the problem that high resolution measurement is not possible. There is a further problem in that since the measurement error described above is unrelated to the time from the start of recording for the waveform of the reflected signal to the detected rise, the shorter the time from the start of recording for the waveforms of the reflected signal until the detected rise, that is, the shorter the distance to the reflecting object, the larger the relative error in the measurement of distance.

The above problem can be improved by increasing the frequency of the sampling clock. However, as the frequency of the sampling clock is increased, it normally becomes necessary to use high-speed electronic components, which are costly compared to low-speed electronic components, resulting in the problem of a large increase in the manufacturing cost of the radar apparatus.

The present invention was conceived in view of the above problems, and it is a principal object of the present invention to provide a radar apparatus that has increased resolution for measuring distances without increasing the frequency of the internal clock.

SUMMARY OF THE INVENTION

A first radar apparatus according to the present invention includes: a modulation signal generating unit that generates a modulation signal with a predetermined pulse width based on an internal clock with a cycle Tc and generates a trigger signal in synchronization with the modulation signal; a carrier wave generating unit that generates a carrier wave; a modulation unit that generates a high frequency signal by modulating the carrier wave using the modulation signal that has been inputted and outputs the high frequency signal; a modulation signal extracting unit that extracts the modulation signal from a component of the high frequency signal that has been transmitted via a transmission antenna, the component having been reflected by a measured object and received by a reception antenna; a detection signal generating unit that generates a detection signal, which can be used to measure a distance to the measured object, based on the trigger signal and the modulation signal extracted by the modulation signal extracting unit; and a pulse width calculating unit that calculates a pulse width of the detection signal, wherein the pulse width calculating unit includes: a delay circuit that generates (n−1) delayed detection signals by delaying the detection signal that has been inputted by Tc/n, 2×Tc/n, . . . , (n−1)×Tc/n, where n is a natural number of 2 or greater; n counter circuits that respectively carry out count operations in synchronization with rising edges or falling edges of the internal clock while the detection signal and the respective delayed detection signals are being inputted; and a calculating circuit that calculates a sum of count values of the respective counter circuits and multiplies the sum by Tc/n to calculate the pulse width of the detection signal.

According to the first radar apparatus, the pulse width calculating unit generates (n−1) delayed detection signals by delaying the detection signal, which can be used to measure the distance to the measured object, by Tc/n, 2×Tc/n, . . . , (n−1)×Tc/n, carries out respective count operations in synchronization with rising edges or falling edges of the internal clock while the detection signal and the delayed detection signals are being inputted, calculates a sum of the n count values produced by the counting, and multiplies the sum by Tc/n to calculate the pulse width of the detection signal, so that the pulse width of the detection signal can be calculated at a high resolution of Tc/n.

A second radar apparatus according to the present invention includes: a modulation signal generating unit that generates a modulation signal with a predetermined pulse width based on an internal clock with a cycle Tc and generates a trigger signal in synchronization with the modulation signal; a carrier wave generating unit that generates a carrier wave; a modulation unit that generates a high frequency signal by modulating the carrier wave using the modulation signal that has been inputted and outputs the high frequency signal; a modulation signal extracting unit that extracts the modulation signal from a component of the high frequency signal that has been transmitted via a transmission antenna, the component having been reflected by a measured object and received by a reception antenna; a detection signal generating unit that generates a detection signal, which can be used to measure a distance to the measured object, based on the trigger signal and the modulation signal extracted by the modulation signal extracting unit; and a pulse width calculating unit that calculates a pulse width of the detection signal, wherein the pulse width calculating unit includes: a delay circuit that generates (n−1) delayed internal clocks by delaying the internal clock that has been inputted by $Tc/n$, $2 \times Tc/n$, ..., $(n-1) \times Tc/n$, where n is a natural number of 2 or greater; n counter circuits that respectively carry out count operations in synchronization with rising edges or falling edges of the internal clock and the respective delayed internal clocks while the detection signal is being inputted; and a calculating circuit that calculates a sum of count values of the respective counter circuits and multiplies the sum by $Tc/n$ to calculate a pulse width of the detection signal.

According to the second radar apparatus, the pulse width calculating unit generates (n−1) delayed internal clocks by delaying the internal clock by $Tc/n$, $2 \times Tc/n$, ..., $(n-1) \times Tc/n$, carries out count operations in synchronization with rising edges or falling edges of the internal clock or respective delayed internal clocks while the detection signal, which can be used to measure a distance to the measured object, is being inputted, calculates a sum of the n count values produced by the counting, and multiplies the sum by $Tc/n$ to calculate the pulse width of the detection signal, so that the pulse width of the detection signal can be calculated at a high resolution of $Tc/n$.

Here, in the first or second radar apparatus, the pulse width calculating unit may calculate the pulse width of the detection signal by adding $Tc/(2 \times n)$ to a result of multiplying the sum by $Tc/n$. With this construction, it is possible to suppress the calculation error for the pulse width of the detection signal to a small range of $\pm Tc/(2 \times n)$.

A third radar apparatus according to the present invention includes: a modulation signal generating unit that generates a modulation signal with a predetermined pulse width based on an internal clock with a cycle Tc and generates a trigger signal in synchronization with the modulation signal; a carrier wave generating unit that generates a carrier wave; a modulation unit that generates a high frequency signal by modulating the carrier wave using the modulation signal that has been inputted and outputs the high frequency signal; a modulation signal extracting unit that extracts the modulation signal from a component of the high frequency signal that has been transmitted via a transmission antenna, the component having been reflected by a measured object and received by a reception antenna; a detection signal generating unit that generates a detection signal, which can be used to measure a distance to the measured object, based on the trigger signal and the modulation signal extracted by the modulation signal extracting unit; and a pulse width calculating unit that calculates a pulse width of the detection signal, wherein the pulse width calculating unit includes: a delay circuit that generates (n−1) delayed detection signals by delaying the detection signal that has been inputted by $Tc/(2 \times n)$, $2 \times Tc/(2 \times n)$, ..., $(n-1) \times Tc/(2 \times n)$, where n is a natural number of 2 or greater; n counter circuits that respectively carry out count operations in synchronization with rising edges and falling edges of the internal clock while the detection signal and the respective delayed detection signals are being inputted; and a calculating circuit that calculates a sum of count values of the respective counter circuits and multiplies the sum by $Tc/(2 \times n)$ to calculate a pulse width of the detection signal.

According to the third radar apparatus, the pulse width calculating unit generates (n−1) delayed detection signals by delaying the detection signal, which can be used to measure the distance to the measured object, by $Tc/(2 \times n)$, $2 \times Tc/(2 \times n)$, ..., $(n-1) \times Tc/(2 \times n)$, carries out count operations in synchronization with rising edges and falling edges of the internal clock while the detection signal and the delayed detection signals are being inputted, calculates a sum of the n count values produced by the counting, and multiplies the sum by $Tc/(2 \times n)$ to calculate the pulse width of the detection signal, so that the pulse width of the detection signal can be calculated at a high resolution of $Tc/(2 \times n)$.

A fourth radar apparatus according to the present invention includes: a modulation signal generating unit that generates a modulation signal with a predetermined pulse width based on an internal clock with a cycle Tc and generates a trigger signal in synchronization with the modulation signal; a carrier wave generating unit that generates a carrier wave; a modulation unit that generates a high frequency signal by modulating the carrier wave using the modulation signal that has been inputted and outputs the high frequency signal; a modulation signal extracting unit that extracts the modulation signal from a component of the high frequency signal that has been transmitted via a transmission antenna, the component having been reflected by a measured object and received by a reception antenna; a detection signal generating unit that generates a detection signal, which can be used to measure a distance to the measured object, based on the trigger signal and the modulation signal extracted by the modulation signal extracting unit; and a pulse width calculating unit that calculates a pulse width of the detection signal, wherein the pulse width calculating unit includes: a delay circuit that generates (n−1) delayed internal clocks by delaying the internal clock that has been inputted by $Tc/(2 \times n)$, $2 \times Tc/(2 \times n)$, ..., $(n-1) \times Tc/(2 \times n)$, where n is a natural number of 2 or greater; n counter circuits that respectively carry out count operations in synchronization with rising edges and falling edges of the internal clock and the delayed internal clocks while the detection signal is being inputted; and a calculating circuit that calculates a sum of count values of the respective counter circuits and multiplies the sum by $Tc/(2 \times n)$ to calculate a pulse width of the detection signal.

According to the fourth radar apparatus, the pulse width calculating unit generates (n−1) delayed internal clocks by delaying the internal clock by $Tc/(2 \times n)$, $2 \times Tc/(2 \times n)$, ..., $(n-1) \times Tc/(2 \times n)$, carries out count operations in synchronization with rising edges and falling edges of the internal clock or respective delayed internal clocks while the detection signal, which can be used to measure a distance to the measured object, is being inputted, calculates a sum of the n count values produced by the counting, and multiplies the sum by $Tc/(2 \times n)$ to calculate the pulse width of the detection signal, so that the pulse width of the detection signal can be calculated at a high resolution of $Tc/(2 \times n)$.

Here, in the third or fourth radar apparatus, the pulse width calculating unit may calculate the pulse width of the detection signal by adding $Tc/(4 \times n)$ to a result of multiplying the sum by $Tc/(2 \times n)$. With this construction, it is possible to suppress the calculation error for the pulse width of the detection signal to a small range of $\pm Tc/(4 \times n)$.

It should be noted that the disclosure of the present invention relates to a content of Japanese Patent Application 2003-424518 that was filed on 22 Dec. 2003 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a radar apparatus according to the present invention will now be described with reference to the attached drawings.

First, the construction of a radar apparatus (a "first radar apparatus" according to the present invention) 1 will be described with reference to the drawings.

Figure 1:
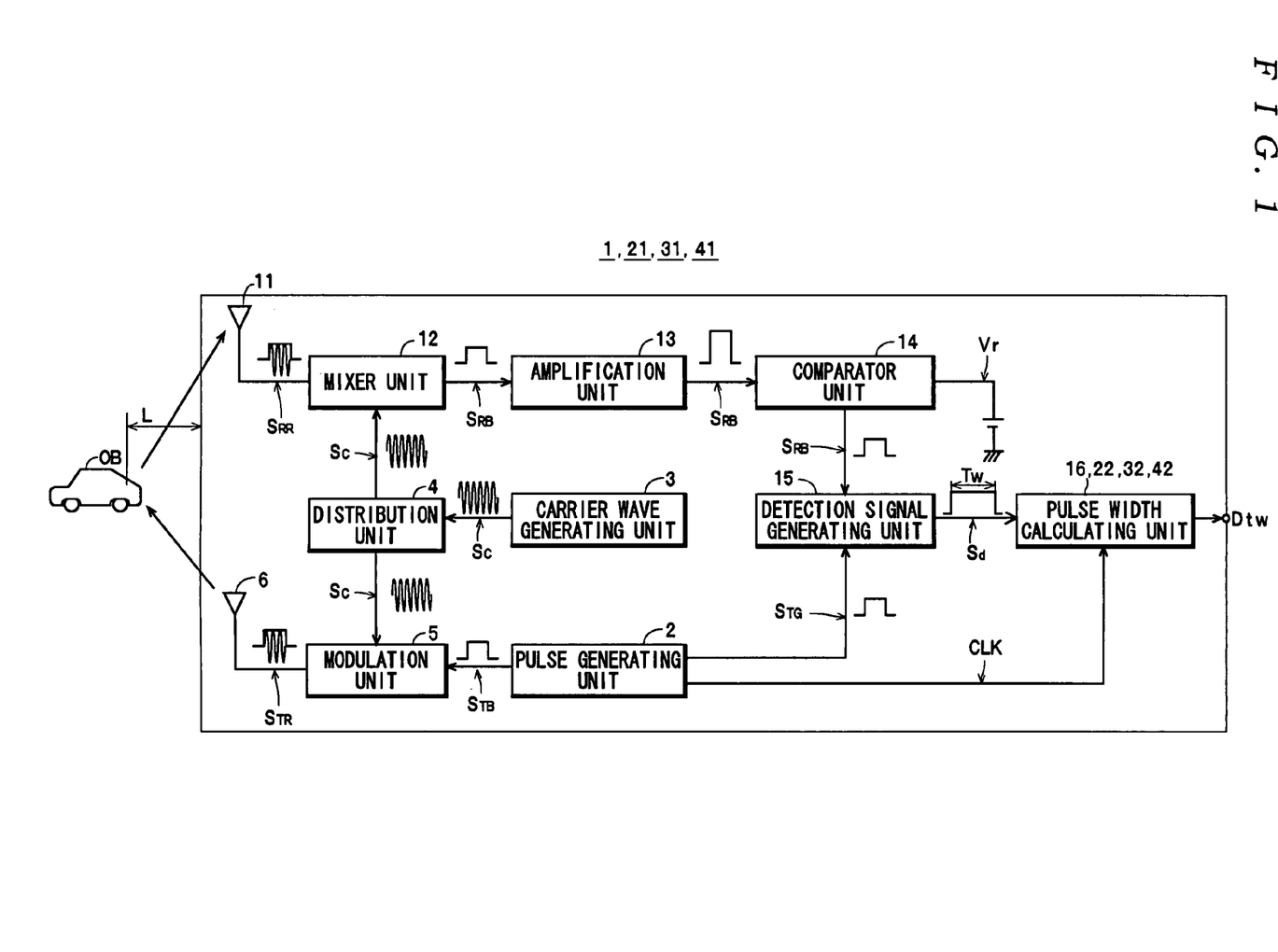
FIG. 1 is a block diagram showing the construction of various radar apparatuses according to the present invention.

As shown in FIG. 1, the radar apparatus 1 includes a pulse generating unit (a "modulation signal generating unit" for the present invention) 2, a carrier wave generating unit 3, a distribution unit 4, a modulation unit 5, a transmission antenna 6, a reception antenna 11, a mixer unit (a "modulation signal extracting unit" for the present invention) 12, an amplification unit 13, a comparator unit 14, a detection signal generating unit 15, and a pulse width calculating unit 16, and is constructed so as to be capable of generating a detection signal $S_d$ that can be used to calculate a distance L to a measured object (a vehicle, for example) OB and of calculating a pulse width Tw of the detection signal $S_d$.

As shown in FIG. 1, based on an internal clock CLK (with a cycle Tc) outputted from a crystal oscillator (not shown) disposed inside the radar apparatus 1, the pulse generating unit 2 generates a pulse-type trigger signal $S_{TG}$ and outputs the trigger signal $S_{TG}$ to the detection signal generating unit 15. The pulse generating unit 2 generates a pulse-type baseband signal (modulation signal) $S_{TB}$ in synchronization with the trigger signal $S_{TG}$ and outputs the baseband signal $S_{TB}$ to the modulation unit 5. The pulse generating unit 2 also outputs the internal clock CLK to the pulse width calculating unit 16. The carrier wave generating unit 3 continuously generates a carrier wave $S_c$ of a predetermined frequency (24 GHz, for example) in the quasi-millimeter waveband, as one example, and outputs the carrier wave $S_c$ to the distribution unit 4. The distribution unit 4 distributes (outputs) the inputted carrier wave $S_c$ to the modulation unit 5 and the mixer unit 12. The modulation unit 5 modulates the carrier wave $S_c$ using the inputted baseband signal $S_{TB}$ to generate a high frequency signal $S_{TR}$ and has the generated high frequency signal $S_{TR}$ transmitted from the transmission antenna 6. On the other hand, the reception antenna 11 receives a component, which has been reflected by the vehicle OB, out of the high frequency signal $S_{TR}$ transmitted via the transmission antenna 6 and outputs the received component as a high frequency signal $S_{RR}$. Here, the transmission antenna 6 and the reception antenna 11 may be composed of patch antennas, for example.

As shown in FIG. 1, by mixing and down converting the inputted high frequency signal $S_{RR}$ with the carrier wave $S_c$ inputted from the distribution unit 4, the mixer unit 12 extracts, as a baseband signal $S_{RB}$, a signal component corresponding to the baseband signal $S_{TB}$ from the high frequency signal $S_{RR}$, and outputs the baseband signal $S_{RB}$ to the amplification unit 13. As shown in FIG. 1, the amplification unit 13 amplifies the inputted baseband signal $S_{RB}$ and outputs the amplified signal to the comparator unit 14. The comparator unit 14 compares the inputted baseband signal $S_{RB}$ with a reference voltage $V_r$ of a reference power supply, carries out waveform shaping on the baseband signal $S_{RB}$, and outputs the shaped signal to the detection signal generating unit 15. By doing so, noise components in the baseband signal $S_{RB}$ that fall below the reference voltage $V_r$ are removed from the baseband signal $S_{RB}$.

Based on the trigger signal $S_{TG}$ and the baseband signal $S_{RB}$ that has been subjected to waveform shaping, the detection signal generating circuit 15 generates and outputs a detection signal $S_d$. More specifically, the detection signal generating unit 15 is constructed of an RS flip-flop (not shown), for example, with an output signal of the RS flip-flop being set in synchronization with the input of the trigger signal $S_{TG}$ (as one example, in synchronization with a rising edge of the trigger signal $S_{TG}$) and the output signal of the RS flip-flop being reset in synchronization with the input of the baseband signal $S_{RB}$ (as one example, in synchronization with a rising edge of the baseband signal $S_{RB}$). By doing so, a detection signal $S_d$ that rises in synchronization with the input of the trigger signal $S_{TG}$ and falls in synchronization with the input of the baseband signal $S_{RB}$ is generated. With this construction, the pulse width Tw of the detection signal $S_d$ is equal to the time taken for the high frequency signal $S_{TR}$ transmitted from the transmission antenna 6 to reach and return from the vehicle OB.

Figure 2:
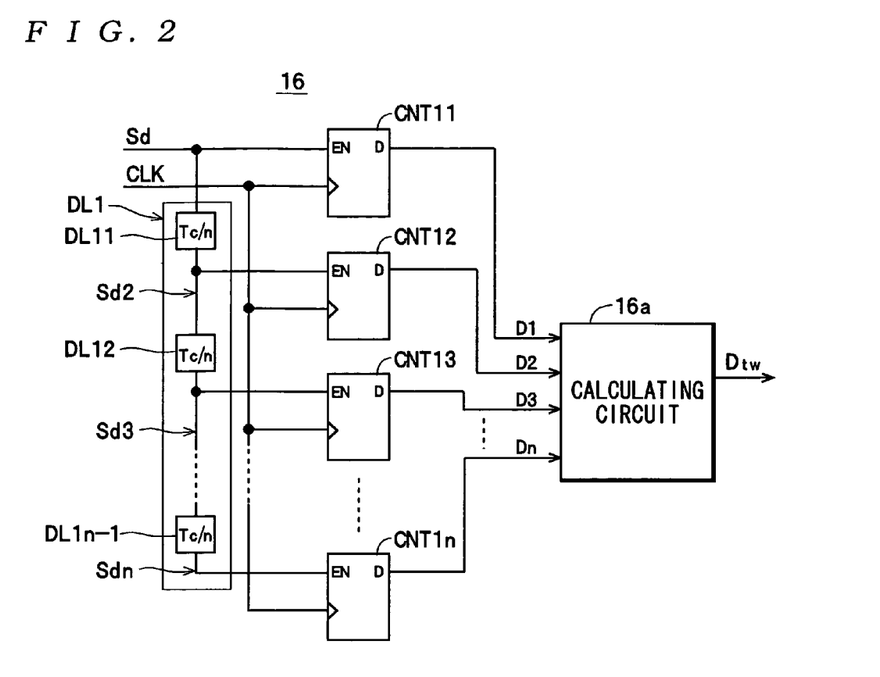
FIG. 2 is a block diagram showing the construction of a pulse width calculating unit of a first radar apparatus.

As shown in FIG. 2, the pulse width calculating unit 16 includes a delay circuit DL1, n counter circuits CNT11 to CNT1$n$, and a calculating circuit 16$a$, and calculates the pulse width Tw of the inputted detection signal $S_d$. The delay circuit DL1 includes (n−1) delay elements DL11 to DL1$n$−1 for which the same delay time (Tc/n) (hereinafter "n" is a natural number of two or greater) is set and is constructed so that the respective delay elements DL11 to DL1n–1 are connected in series in that order. With this construction, the delay circuit DL1 outputs (n–1) delayed detection signals $S_{d2}$ to $S_{dn}$ that are the detection signal $S_d$ inputted from the delay element DL11 side after the detection signal $S_d$ has been delayed by Tc/n, 2×Tc/n, . . . , (n–1)×Tc/n, respectively. The counter circuits CNT11 to CNT1n respectively receive an input of the internal clock CLK via the respective clock terminals and are constructed so as to be capable of a count (up) operation in synchronization with one edge (as one example, rising edges) of the internal clock CLK. The respective counter circuits CNT11 to CNT1n receive inputs of the detection signal $S_d$, the delayed detection signals $S_{d2}$, $S_{d3}$, . . . , $S_{dn}$ via enable terminals (labeled "EN" in the drawings). With this construction, the respective counter circuits CNT11 to CNT1n carry out count operations in synchronization with the internal clock CLK while the detection signal $S_d$ and the delayed detection signals $S_{d2}$, $S_{d3}$, . . . , $S_{dn}$ are being inputted and output count values D1 to Dn in accordance with (approximately in proportion to) the pulse widths of the detection signal $S_d$ and the delayed detection signal $S_{d2}$, $S_{d3}$, . . . , $S_{dn}$. The calculating circuit 16a is composed of a CPU, for example, and calculates a sum Dsum of the respective count values D1 to Dn. The calculating circuit 16a multiplies the calculated sum Dsum by Tc/n and adds Tc/(2×n) to the multiplication result to calculate the pulse width Tw of the detection signal $S_d$. The calculating circuit 16a also outputs pulse width data Dtw showing the calculated pulse width Tw.

Next, the overall operation of the radar apparatus 1 will be described with reference to FIG. 1 and FIGS. 3 to 6. It should be noted that for ease of understanding the present invention, an example will be described where n=4, that is, a construction where the pulse width calculating unit 16 includes four counter circuits CNT11 to CNT14 and the delay circuit DL1 that is composed of three delay elements DL11 to DL13.

As shown in FIG. 1, in the radar apparatus 1, the pulse generating unit 2 generates and outputs the trigger signal $S_{TG}$ to the detection signal generating unit 15 and outputs the generated baseband signal $S_{TB}$ in synchronization with the trigger signal $S_{TG}$ to the modulation unit 5. In this case, the detection signal generating unit 15 starts to generate the detection signal $S_d$ in synchronization with the trigger signal $S_{TG}$ inputted from the pulse generating unit 2. On the other hand, the modulation unit 5 modulates the carrier wave $S_c$ outputted from the distribution unit 4 using the baseband signal $S_{TB}$ inputted from the pulse generating unit 2 to generate the high frequency signal $S_{TR}$ and outputs the high frequency signal $S_{TR}$ to the transmission antenna 6. By doing so, the high frequency signal $S_{TR}$ is transmitted from the transmission antenna 6.

On the other hand, after a predetermined time T1 has passed from output of the baseband signal $S_{TB}$ (that is, the trigger signal $S_{TG}$) by the pulse generating unit 2, the reception antenna 11 inputs the high frequency signal $S_{TR}$ that has been reflected by the vehicle OB. Here, the predetermined time T1 is the time taken for the high frequency signal $S_{TR}$ to go back and forth on the distance L between the radar apparatus 1 and the vehicle OB, that is, the time taken to cover a distance (2×L) that is double the distance L.

Next, the mixer unit 12 mixes the high frequency signal $S_{RR}$ inputted from the reception antenna 11 and the carrier wave $S_c$ to extract the baseband signal $S_{RB}$. After this, the baseband signal $S_{RB}$ outputted from the mixer unit 12 is amplified by the amplification unit 13, subjected to waveform shaping by the comparator unit 14, and then inputted into the detection signal generating unit 15. Next, the detection signal generating unit 15 resets the output signal of the RS flip-flop in synchronization with the inputted baseband signal $S_{RB}$ to stop the outputting of the detection signal $S_d$. By doing so, the detection signal generating unit 15 outputs the detection signal $S_d$ with the same pulse width Tw as the predetermined time T1.

On the other hand, in the pulse width calculating unit 16, the delay circuit DL1 delays the detection signal $S_d$ generated by the detection signal generating unit 15 by Tc/4, 2×Tc/4, and 3×Tc/4 respectively to generate the delayed detection signals $S_{d2}$, $S_{d3}$, and $S_{d4}$. The counter circuit CNT11 carries out a count operation in synchronization with the internal clock CLK while the detection signal $S_d$ is being inputted and outputs the count value D1 showing the pulse width of the detection signal $S_d$. Also, the counter circuits CNT12, CNT13, and CNT14 carry out a count operation in synchronization with the internal clock CLK while the delayed detection signals $S_{d2}$, $S_{d3}$, and $S_{d4}$ are respectively being inputted and output the respective count values D2, D3, and D4 showing the pulse widths of the delayed detection signals $S_{d2}$, $S_{d3}$, and $S_{d4}$.

Figure 3:
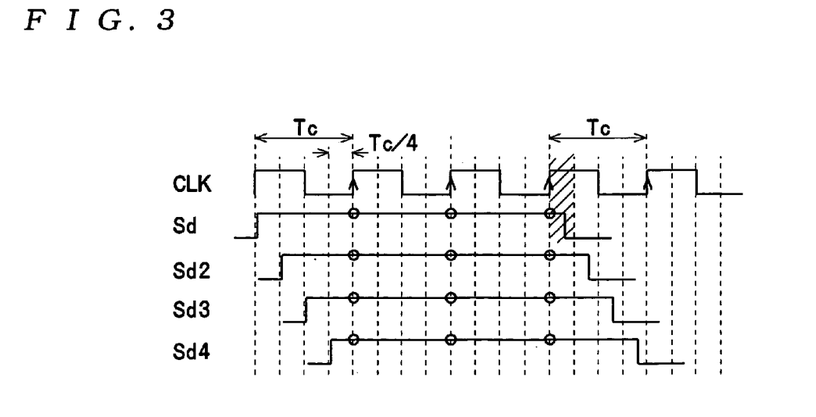
FIG. 3 is a timing chart useful in explaining the operation of the pulse width calculating unit shown in FIG. 2.
Figure 4:
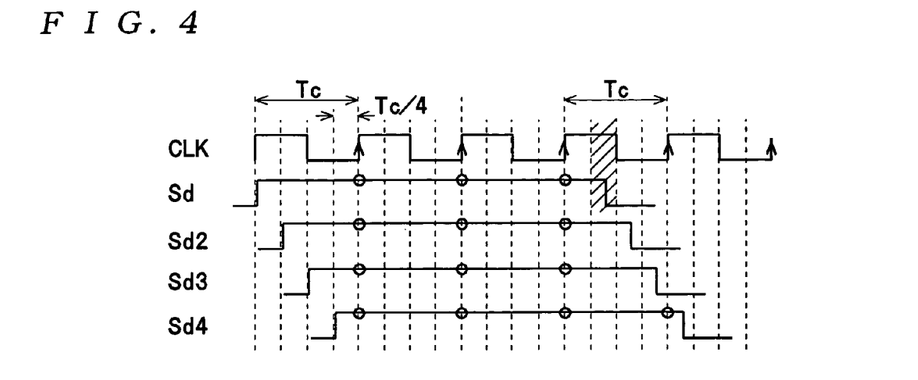
FIG. 4 is a timing chart useful in explaining the operation of the pulse width calculating unit shown in FIG. 2.

Here, as shown in FIG. 3, when a falling edge of the detection signal $S_d$ is included in the first one quarter section in one cycle Tc of the internal clock CLK (the section diagonally shaded in FIG. 3), that is, when the pulse width of the detection signal $S_d$ is at least (m×Tc) but less than (m×Tc+Tc/4) (hereinafter, "m" is a natural number), the respective falling edges of each of the delayed detection signals $S_{d2}$ to $S_{d4}$ are included in the same cycle of the internal clock CLK as the falling edge of the detection signal $S_d$. Accordingly, as shown in FIG. 3, when m=3 for example, the respective counter circuits CNT11 to CNT14 respectively carry out three count operations in synchronization with the rising edges of the internal clock CLK at the timing indicated by the circle marks in FIG. 3. For this reason, the respective count values D1 to D4 are all 3. On the other hand, as shown in FIG. 4, when the falling edge of the detection signal $S_d$ is included in the second one quarter section in one cycle Tc of the internal clock CLK (the section diagonally shaded in FIG. 4), that is, when the pulse width of the detection signal $S_d$ is at least (m×Tc+Tc/4) but less than (m×Tc+Tc/2), the respective falling edges of the delayed detection signals $S_{d2}$ and $S_{d3}$ are included in the same cycle of the internal clock CLK as the falling edge of the detection signal $S_d$, but the falling edge of the delayed detection signals $S_{d4}$ is included in the next cycle of the internal clock CLK. Accordingly, as shown in FIG. 4, when m=3 for example, the respective counter circuits CNT11 to CNT13 respectively carry out three count operations in synchronization with the rising edges of the internal clock CLK at the timing indicated by the circle marks in FIG. 4. For this reason, the respective count values D1 to D3 each become 3. On the other hand, the counter circuit CNT14 carries out four count operations in synchronization with the rising edge of the internal clock CLK at the timing indicated by the circle marks in FIG. 4, so that the count value D4 becomes 4.

Figure 5:
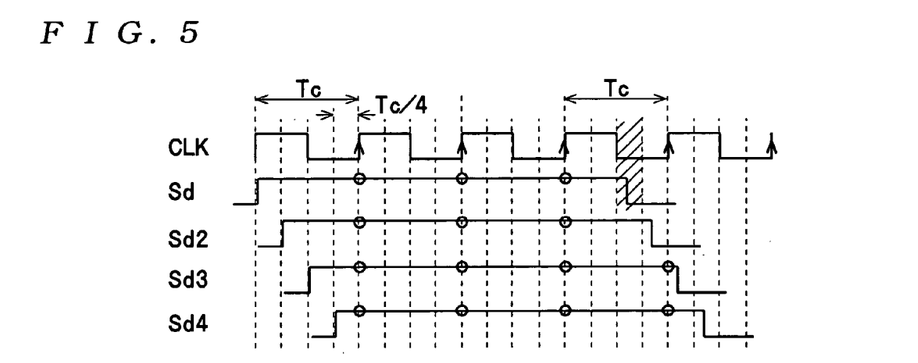
FIG. 5 is a timing chart useful in explaining the operation of the pulse width calculating unit shown in FIG. 2.
Figure 6:
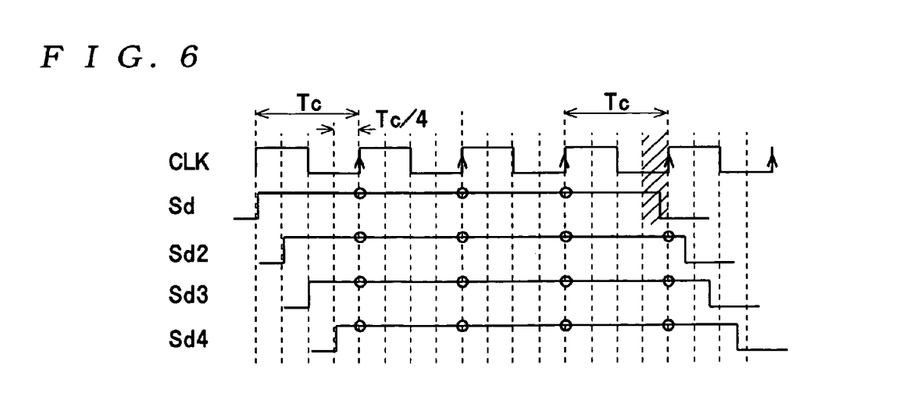
FIG. 6 is a timing chart useful in explaining the operation of the pulse width calculating unit shown in FIG. 2.

In the same way, as shown in FIG. 5, when the falling edge of the detection signal $S_d$ is included in the third one quarter section in one cycle Tc of the internal clock CLK (the section diagonally shaded in FIG. 5), that is, when the pulse width of the detection signal $S_d$ is at least (m×Tc+Tc/2) but less than (m×Tc+Tc×3/4), the falling edge of the delayed detection signal $S_{d2}$ is included in the same cycle of the internal clock CLK as the falling edge of the detection signal $S_d$, but the falling edges of the other delayed detection signals $S_{d3}$ and $S_{d4}$ are included in the next cycle of the internal clock CLK. Accordingly, as shown in FIG. 5, when m=3 for example, the respective counter circuits CNT11 and CNT12 respectively carry out three count operations in synchronization with the rising edges of the internal clock CLK at the timing indicated by the circle marks in FIG. 5. For this reason, the respective count values D1 and D2 each become 3. On the other hand, the counter circuits CNT13 and CNT14 carry out one extra count operation in synchronization with the rising edges of the internal clock CLK at the timing indicated by the circle marks in FIG. 5, so that the respective count values D3 and D4 each become 4. Also, as shown in FIG. 6, when the falling edge of the detection signal $S_d$ is included in the final one quarter section in one cycle Tc of the internal clock CLK (the section diagonally shaded in FIG. 6), that is, when the pulse width of the detection signal $S_d$ is at least (m×Tc+Tc×3/4) but less than (m+1)×Tc, the falling edges of all of the delayed detection signals $S_{d2}$ to $S_{d4}$ are included in the cycle of the internal clock CLK that follows the cycle including the falling edge of the detection signal $S_d$. Accordingly, as shown in FIG. 6, when m=3 for example, the counter circuit CNT11 carries out three count operations in synchronization with the rising edges of the internal clock CLK at the timing indicated by the circle marks in FIG. 6. For this reason, the count value D1 becomes 3. On the other hand, the counter circuits CNT12 to CNT14 carry out one further count operation in synchronization with the rising edges of the internal clock CLK at the timing indicated by the circle marks in FIG. 5, so that the respective count values D2, D3 and D4 each become 4.

The calculating circuit 16a calculates the sum Dsum of the respective count values D1 to D4 outputted in this way from the respective counter circuits CNT11 to CNT14, multiplies the total Dsum by Tc/4, and further adds Tc/(2×4) to calculate the pulse width Tw of the detection signal $S_d$. More specifically, when the pulse width of the detection signal $S_d$ is the length shown in FIG. 3, the sum Dsum of the respective count values D1 to D4 is 12, so that the calculating circuit 16a calculates the pulse width Tw of the detection signal $S_d$ as 3.125×Tc (=12×Tc/4+Tc/8). When the pulse width of the detection signal $S_d$ is the length shown in FIG. 4, the sum Dsum of the respective count values D1 to D4 is 13, so that the calculating circuit 16a calculates the pulse width Tw of the detection signal $S_d$ as 3.375×Tc (=13×Tc/4+Tc/8). When the pulse width of the detection signal $S_d$ is the length shown in FIG. 5, the sum Dsum of the respective count values D1 to D4 is 14, so that the calculating circuit 16a calculates the pulse width Tw of the detection signal $S_d$ as 3.625×Tc (=14×Tc/4+Tc/8). When the pulse width of the detection signal $S_d$ is the length shown in FIG. 6, the sum Dsum of the respective count values D1 to D4 is 15, so that the calculating circuit 16a calculates the pulse width Tw of the detection signal $S_d$ as 3.875×Tc (=15×Tc/4+Tc/8). In this way, the pulse width calculating unit 16 calculates the pulse width Tw of the detection signal $S_d$ at a high resolution of Tc/4 (the respective phase differences between the detection signal $S_d$ and the delayed detection signals $S_{d2}$, $S_{d3}$, and $S_{d4}$) and, by adding one half (Tc/8) of this phase difference (the delay time Tc/4 of the delay elements DL11 to DL13), with an error of ±Tc/8. The pulse width calculating unit 16 outputs the pulse width data Dtw showing the calculated pulse width Tw to the outside. After this, an external apparatus uses the pulse width data Dtw outputted from the radar apparatus 1 as it is and calculates the distance L between the radar apparatus 1 and the vehicle OB based on half the time of the pulse width data Dtw and the speed of light.

In this way, with the radar apparatus 1, the pulse width calculating unit 16 generates, based on the detection signal $S_d$ that can be used to measure the distance L to the vehicle OB, (n−1) delayed detection signals $S_{d2}$, $S_{d3}$, ..., $S_{dn}$ whose phases are respectively shifted by Tc/n with respect to the detection signal $S_d$. The respective pulse widths of the detection signal $S_d$ and the delayed detection signals $S_{d2}$, $S_{d3}$, ..., $S_{dn}$ are counted in synchronization with the internal clock CLK using the n counter circuits CNT11, CNT12, ..., CNT1n and the sum Dsum of the n count values D1, D2, ..., Dn found by this counting is calculated. By multiplying the sum Dsum by Tc/n to calculate the pulse width Tw of the detection signal $S_d$, the pulse width Tw of the detection signal $S_d$ can be calculated with a high resolution of Tc/n. In addition, in the radar apparatus 1, the pulse width calculating unit 16 adds a time Tc/(2×n) to the value produced by multiplying the sum Dsum by Tc/n, so that it is possible to calculate the pulse width Tw of the detection signal $S_d$ with an error range of ±Tc/(2×n). Accordingly, even if the radar apparatus 1 is used as a radar apparatus for detecting a distance to a measured object (for example, the vehicle OB) at a short distance (for example, several tens of centimeters), the distance to the measured object can be accurately calculated.

It should be noted that the present invention is not limited to the construction described above. For example, although the radar apparatus 1 has been described by way of an example that uses counter circuits CNT11 to CNT1n, which carry out count operations in synchronization with one edge (rising edges or falling edges, in the above example, the rising edges) of the internal clock CLK as the pulse width calculating unit 16, it is also possible to construct a radar apparatus 21 that uses a pulse width calculating unit 22 shown in FIG. 7 composed of counter circuits CNT21, CNT22, ..., CNT2n that carry out count operations in synchronization with the rising edges and falling edges of the internal clock CLK.

Aside from using the pulse width calculating unit 22 in place of the pulse width calculating unit 16, the radar apparatus 21 (a "third radar apparatus" for the present invention) has the same construction as the radar apparatus 1 shown in FIG. 1. For this reason, component parts that are the same as in the radar apparatus 1 have been assigned the same reference numerals and duplicated description thereof has been omitted. The description will instead focus on the difference with the radar apparatus 1, that is, the pulse width calculating unit 22.

Figure 7:
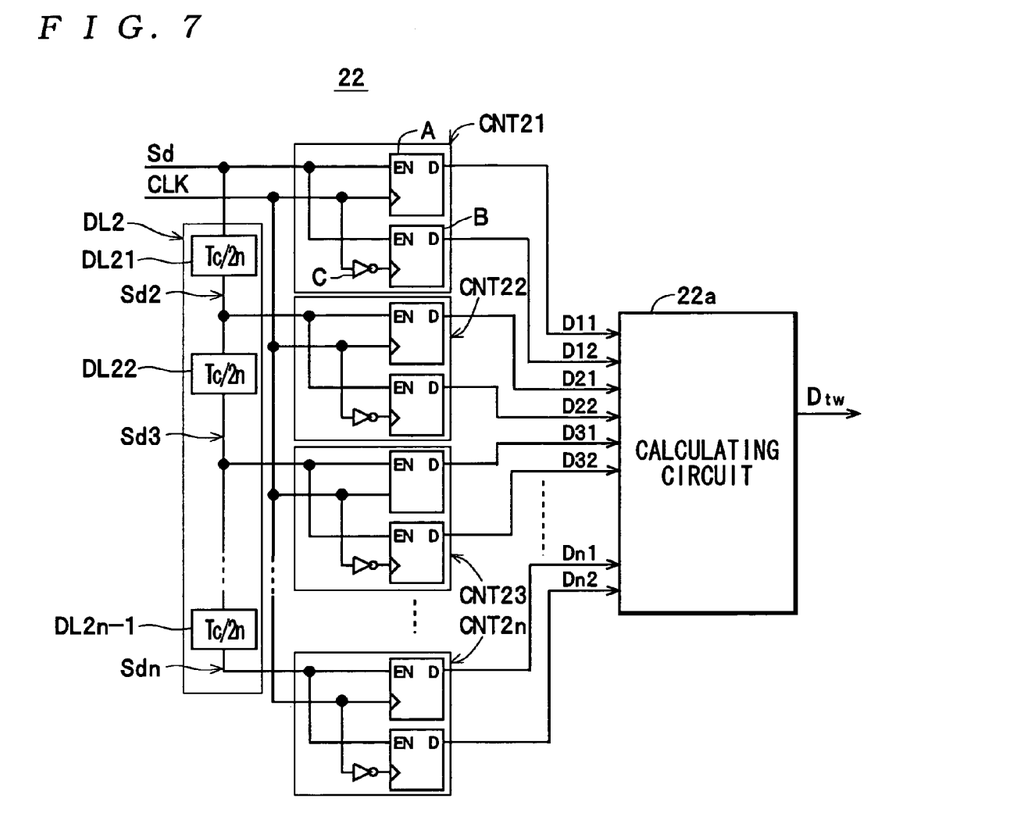
FIG. 7 is a block diagram showing the construction of a pulse width calculating unit of a third radar apparatus.

As shown in FIG. 7, the pulse width calculating unit 22 includes a delay circuit DL2, n counter circuits CNT21 to CNT2n, and a calculating circuit 22a, and calculates the pulse width Tw of the inputted detection signal $S_d$. The delay circuit DL2 includes (n−1) delay elements DL21 to DL2n−1 for which the same delay time (Tc/(2×n)) is set and is constructed so that the respective delay elements DL21 to DL2n−1 are connected in series in that order. With this construction, the delay circuit DL2 outputs (n−1) delayed detection signals $S_{d2}$ to $S_{dn}$ that are the detection signal $S_d$ inputted from the delay element DL21 side after the detection signal $S_d$ has been delayed by Tc/(2×n), 2×Tc/(2×n), ..., (n−1)×Tc/(2×n), respectively. Each of the counter circuits CNT21 to CNT2n respectively includes a counter A, a counter B, and an inverter C. Each counter A receives an input of the detection signal $S_d$ or the one of the delayed detection signals $S_{d2}$ to $S_{dn}$ into an enable terminal and a direct input of the internal clock CLK via a clock terminal and carries out a count operation in synchronization with one edge (as one example, rising edges) of the internal clock CLK while the detection signal $S_d$ or delayed detection signal (one of $S_{d2}$ to $S_{dn}$) is being inputted. By doing so, the counters A of the respective counter circuits CNT21 to CNT2n output the count values (D11, D21, . . . , Dn1) showing the pulse width of the detection signal $S_d$. On the other hand, each counter B of the respective counter circuits CNT21 to CNT2n receives an input of the detection signal $S_d$ or one of the delayed detection signals $S_{d2}$ to $S_{dn}$ into an enable terminal and an input of the internal clock CLK that has been inverted by the inverter C via a clock terminal, and carries out a count operation in synchronization with the other edge (as one example, falling edges) of the internal clock CLK while the detection signal $S_d$ or delayed detection signal (one of $S_{d2}$ to $S_{dn}$) is being inputted. By doing so, the counters B output count values (D12, D22, . . . , Dn2) showing the pulse width of the detection signal $S_d$. The calculating circuit 22a is composed of a CPU, for example, and calculates a sum Dsum of the respective count values D11, D12, D21, D22, . . . , Dn1, Dn2. The calculating circuit 22a multiplies the calculated sum Dsum by Tc/(2×n) and adds Tc/(4×n) to the value produced by the multiplication. By doing so, the calculating circuit 22a calculates the pulse width Tw of the detection signal $S_d$. The calculating circuit 22a also outputs the pulse width data Dtw showing the calculated pulse width Tw.

Next, the overall operation of the radar apparatus 21 will be described with reference to FIGS. 7 to 11. It should be noted that for ease of understanding the present invention, an example will be described where n=4, that is, the pulse width calculating unit 22 includes four counter circuits CNT21 to CNT24 and the delay circuit DL2 which is composed of three delay elements DL21 to DL23.

As shown in FIG. 1, in the radar apparatus 21, the pulse generating unit 2, the carrier wave generating unit 3, the distribution unit 4, the modulation unit 5, the mixer unit 12, the amplification unit 13, the comparator unit 14 and the detection signal generating unit 15 operate in the same way as in the radar apparatus 1 so that the detection signal generating unit 15 outputs the detection signal $S_d$.

In this case, in the pulse width calculating unit 22, the delay circuit DL2 delays the detection signal $S_d$ by Tc/(2×4), 2×Tc/(2×4), and 3×Tc/(2×4) respectively to generate the delayed detection signals $S_{d2}$, $S_{d3}$, and $S_{d4}$. In this case, in the counter circuit CNT21, the counter A carries out a count operation in synchronization with rising edges of the internal clock CLK and outputs the count value D11 showing the pulse width of the detection signal $S_d$. Similarly, the counter B carries out a count operation in synchronization with falling edges of the internal clock CLK and outputs the count value D12 showing the pulse width of the detection signal $S_d$. In the same way, in the counter circuits CNT22, CNT23, and CNT24, the respective counters A carry out a count operation in synchronization with rising edges of the internal clock CLK and output the count values D21, D31, and D41 showing the pulse widths of the delayed detection signals $S_{d2}$, $S_{d3}$, and $S_{d4}$. Also, the respective counters B carry out a count operation in synchronization with falling edges of the internal clock CLK and output the count values D22, D32, and D42 showing the pulse widths of the delayed detection signals $S_{d2}$, $S_{d3}$, and $S_{d4}$.

Figure 8:
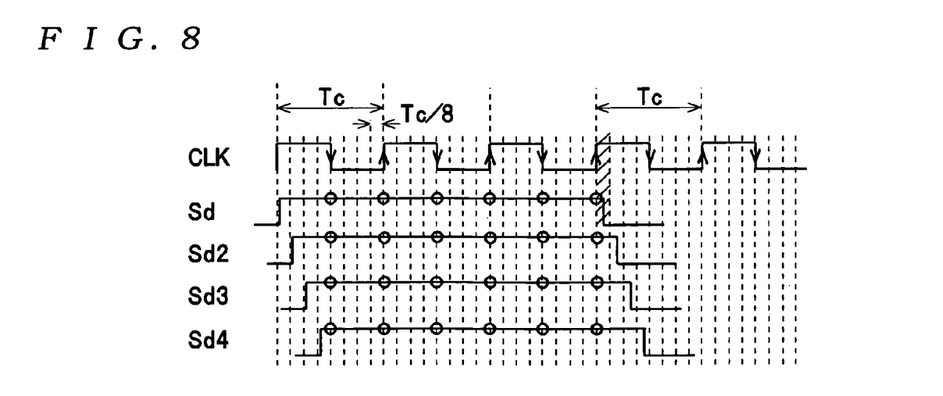
FIG. 8 is a timing chart useful in explaining the operation of the pulse width calculating unit shown in FIG. 7.

Here, as shown in FIG. 8, when a falling edge of the detection signal $S_d$ is included in the first one eighth section in one cycle Tc of the internal clock CLK (the section diagonally shaded in FIG. 8), that is, when the pulse width of the detection signal $S_d$ is at least (m×Tc) but less than (m×Tc+Tc/8), the respective falling edges of each of the delayed detection signals $S_{d2}$ to $S_{d4}$ are included in the same half cycle section (i.e., the first half of one cycle) of the internal clock CLK as the falling edge of the detection signal $S_d$. Accordingly, as shown in FIG. 8, when m=3 for example, the counters A and B in each of the counter circuits CNT21 to CNT24 respectively carry out three count operations (in synchronization with rising edges and falling edges of the internal clock CLK) at the timing indicated by the circle marks in FIG. 8. As a result, the count values D11, D12, D21, D22, . . . , D41, D42 of the respective counters A, B outputted from the counter circuits CNT21 to CNT24 are all 3. Accordingly, the totals of the count values of the counters A and B outputted from the respective counter circuits CNT21 to CNT24 are each 6, as shown by the circle marks in FIG. 8.

Figure 9:
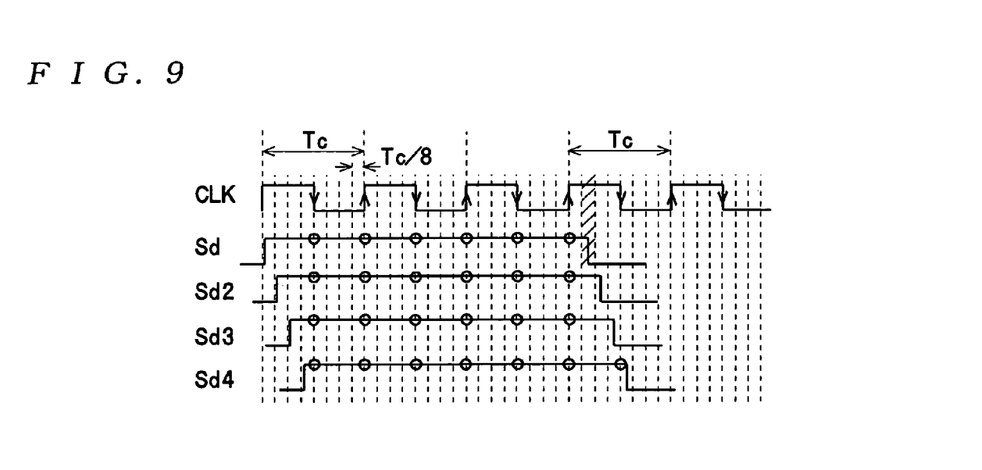
FIG. 9 is a timing chart useful in explaining the operation of the pulse width calculating unit shown in FIG. 7.

Also, as shown in FIG. 9, when a falling edge of the detection signal $S_d$ is included in the second one eighth section in one cycle Tc of the internal clock CLK (the section diagonally shaded in FIG. 9), that is, when the pulse width of the detection signal $S_d$ is at least (m×Tc+Tc/8) but less than (m×Tc+Tc/4), the respective falling edges of the delayed detection signals $S_{d2}$, $S_{d3}$ are included in the same half cycle section of the internal clock CLK as the falling edge of the detection signal $S_d$. On the other hand, the falling edge of the delayed detection signal $S_{d4}$ is included in a half cycle following the half cycle of the internal clock CLK that includes the falling edge of the detection signal $S_d$. Accordingly, only the counter B of the counter circuit CNT24 carries out four count operations, with the other counters A, B carrying out three count operations. As a result, out of the count values D11, D12, D21, D22, . . . , D41, D42 of the respective counters A, B outputted from the respective counter circuits CNT21 to CNT24, only the count value D42 is 4, with the other count values being 3. Accordingly, as shown by the circle marks in FIG. 9, the respective totals of the count values of the counters A and B outputted from the counter circuits CNT21 to CNT24 are 6 for the counter circuits CNT21 to CNT23 and 7 for the counter circuit CNT24.

Figure 10:
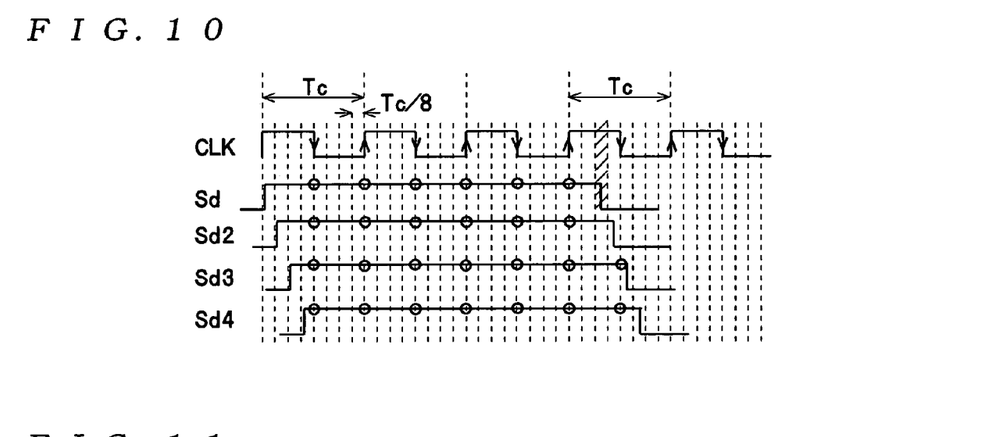
FIG. 10 is a timing chart useful in explaining the operation of the pulse width calculating unit shown in FIG. 7.

Also, as shown in FIG. 10, when a falling edge of the detection signal $S_d$ is included in the third one eighth section in one cycle Tc of the internal clock CLK (the section diagonally shaded in FIG. 10), that is, when the pulse width of the detection signal $S_d$ is at least (m×Tc+Tc/4) but less than (m×Tc+Tc×3/8), the falling edge of the delayed detection signal $S_{d2}$ is included in the same half cycle section of the internal clock CLK as the falling edge of the detection signal $S_d$. On the other hand, the falling edge of the delayed detection signal $S_{d3}$, like the delayed detection signal $S_{d4}$, is included in a half cycle following a half cycle of the internal clock CLK that includes the falling edge of the detection signal $S_d$. Accordingly, the counter B in the counter circuit CNT23 carries out four count operations in the same way as the counter B in the counter circuit CNT24. It should be noted that the other counters A, B still carry out three count operations. As a result, out of the count values D11, D12, D21, D22, . . . , D41, D42 of the respective counters A, B outputted from the respective counter circuits CNT21 to CNT24, only the count values D32, D42 are 4, with the other count values being 3. Accordingly, as shown by the circle marks in FIG. 10, the respective totals of the count-values of the counters A and B outputted from the counter circuits CNT21 to CNT24 are each 6 for the counter circuits CNT21 and CNT22 and are 7 for the counter circuits CNT23 and CNT24.

Figure 11:
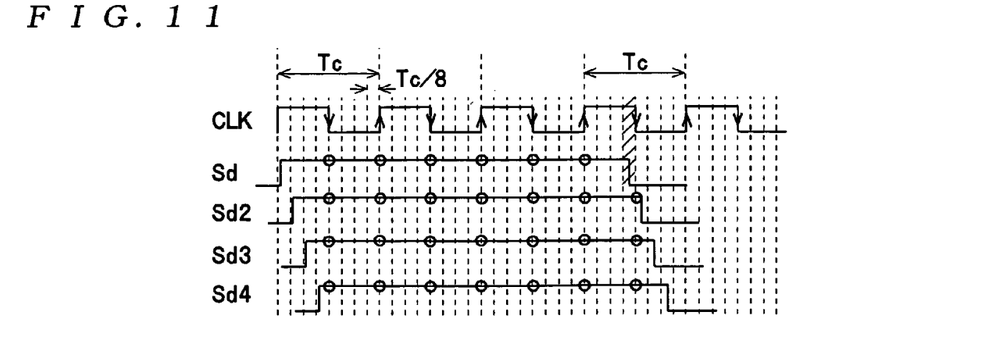
FIG. 11 is a timing chart useful in explaining the operation of the pulse width calculating unit shown in FIG. 7.

Also, as shown in FIG. 11, when a falling edge of the detection signal $S_d$ is included in the fourth one eighth section in one cycle Tc of the internal clock CLK (the section diagonally shaded in FIG. 11), that is, when the pulse width of the detection signal $S_d$ is at least (m×Tc+Tc×3/8) but less than (m×Tc+Tc/2), the falling edges of the respective delayed detection signals $S_{d2}$ to $S_{d4}$ are included in a half cycle following the half cycle of the internal clock CLK in which the falling edge of the detection signal $S_d$ is included. Accordingly, the counter B of the counter circuit CNT22 carries out four count operations in the same way as the respective counters B in the counter circuits CNT23 and CNT24. It should be noted that the count values of the other counters A and B are 3. As a result, out of the count values D11, D12, D21, D22, . . . , D41, D42 of the respective counters A, B outputted from the respective counter circuits CNT21 to CNT24, only the count values D22, D32, and D42 are 4, with the other count values being 3. Accordingly, as shown by the circle marks in FIG. 11, the totals of the count values of the respective counters A, B outputted from the counter circuits CNT21 to CNT24 are each 6 for the counter circuits CNT21 and are 7 for the respective counter circuits CNT22, CNT23 and CNT24.

Hereinafter, although not shown in the drawings, as described above, by lengthening the pulse width Tw of the detection signal $S_d$ to shift a one eighth section inside one cycle Tc of the internal clock CLK in which a falling edge of the detection signal $S_d$ is included by one section at a time, the totals of the count values D11, D12, D21, D22, . . . , D41, D42 of the counters A, B outputted from the counter circuits CNT21 to CNT24 increase one at a time. More specifically, when the falling edge of the detection signal $S_d$ is included in the fifth one eighth section in one cycle Tc of the internal clock CLK, that is, when the pulse width of the detection signal $S_d$ is at least (m×Tc+Tc/2) but less than (m×Tc+Tc×5/8), the totals of the count values of the counters A and B outputted from the counter circuits CNT21 to CNT24 are respectively 7. Also, when the falling edge of the detection signal $S_d$ is included in the sixth one eighth section in one cycle Tc of the internal clock CLK, that is, when the pulse width of the detection signal $S_d$ is at least (m×Tc+Tc×5/8) but less than (m×Tc+Tc×6/8), the totals of the count values of the counters A and B outputted from the counter circuits CNT21 to CNT24 are respectively 7 for the CNT21 to CNT23 and 8 for the counter circuit CNT24. When the falling edge of the detection signal $S_d$ is included in the seventh one eighth section in one cycle Tc of the internal clock CLK, that is, when the pulse width of the detection signal $S_d$ is at least (m×Tc+Tc×6/8) but less than (m×Tc+Tc×7/8), the totals of the count values of the counters A and B outputted from the counter circuits CNT21 to CNT24 are 7 for the counter circuits CNT21 and CNT22 and 8 for the counter circuits CNT23 and CNT24. When the falling edge of the detection signal $S_d$ is included in the final one eighth section in one cycle Tc of the internal clock CLK, that is, when the pulse width of the detection signal $S_d$ is at least (m×Tc+Tc×7/8) but less than (m×Tc+Tc), the totals of the count values of the respective counters A, B outputted from the counter circuits CNT21 to CNT24 are respectively 7 for the CNT21 and 8 for the counter circuits CNT22 to CNT24.

The calculating circuit 22a calculates the sum Dsum of the count values D11 to D42 outputted from the respective counter circuits CNT21 to CNT24, multiplies the sum Dsum by Tc/(2×4), and further adds Tc/(4×4) to calculate the pulse width Tw of the detection signal $S_d$. More specifically, when the pulse width of the detection signal $S_d$ is the length shown in FIG. 8, that is, when the pulse width of the detection signal $S_d$ is at least (3×Tc) but less than (3×Tc+Tc/8), the sum Dsum of the respective count values D1 to D42 is 3×8=24, so that the calculating circuit 22a calculates the pulse width Tw of the detection signal $S_d$ as 3.0625×Tc (=24×Tc/8+Tc/16). When the pulse width of the detection signal $S_d$ is the length shown in FIG. 9, that is, when the pulse width of the detection signal $S_d$ is at least (3×Tc+Tc/8) but less than (3×Tc+Tc/4), the sum Dsum of the respective count values D11 to D42 is 3×7+4=25, so that the calculating circuit 22a calculates the pulse width Tw of the detection signal $S_d$ as 3.1875×Tc (=25×Tc/8+Tc/16). Also, when the pulse width of the detection signal $S_d$ is at least (3×Tc+Tc/4) but less than (3×Tc+Tc×3/8), the sum Dsum of the respective count values D11 to D42 is 3×6+4×2=26, so that the calculating circuit 22a calculates the pulse width Tw of the detection signal $S_d$ as 3.3125×Tc (=26×Tc/8+Tc/16). Also, when the pulse width of the detection signal $S_d$ is at least (3×Tc+Tc×3/8) but less than (3×Tc+Tc/2), the sum Dsum of the respective count values D11 to D42 is 3×5+4×3=27, so that the calculating circuit 22a calculates the pulse width Tw of the detection signal $S_d$ as 3.4375×Tc (=27×Tc/8+Tc/16).

Also, when the pulse width of the detection signal $S_d$ is at least (3×Tc+Tc/2) but less than (3×Tc+Tc×5/8), the sum Dsum of the respective count values D11 to D42 is 3×4+4×4=28, so that the calculating circuit 22a calculates the pulse width Tw of the detection signal $S_d$ as 3.5625×Tc (=28×Tc/8+Tc/16) When the pulse width of the detection signal $S_d$ is at least (3×Tc+Tc×5/8) but less than (3×Tc+Tc×6/8), the sum Dsum of the respective count values D1 to D42 is 3×3+4×5=29, so that the calculating circuit 22a calculates the pulse width Tw of the detection signal $S_d$ as 3.6875×Tc (=29×Tc/8+Tc/16) When the pulse width of the detection signal $S_d$ is at least (3×Tc+Tc×6/8) but less than (3×Tc+Tc×7/8), the sum Dsum of the respective count values D11 to D42 is 3×2+4×6=30, so that the calculating circuit 22a calculates the pulse width Tw of the detection signal $S_d$ as 3.8125×Tc (=30×Tc/8+Tc/16) When the pulse width of the detection signal $S_d$ is at least (3×Tc+Tc×7/8) but less than (3×Tc+Tc), the sum Dsum of the respective count values D11 to D42 is 3×1+4×7=31, so that the calculating circuit 22a calculates the pulse width Tw of the detection signal $S_d$ as 3.9375×Tc (=31×Tc/8+Tc/16). Accordingly, the pulse width calculating unit 22 can calculate the pulse width Tw of the detection signal $S_d$ at a high resolution of Tc/8 (the phase difference of the detection signal $S_d$ and the respective delayed detection signals $S_{d2}$, $S_{d3}$, and $S_{d4}$), and by further adding half (=Tc/16) the phase difference (the delay time Tc/8 of the delay elements DL21 to DL23), the pulse width Tw of the detection signal $S_d$ is calculated with an error of ±Tc/16. Accordingly, even if the radar apparatus 21 is used as a radar apparatus for detecting a distance to a measured object (for example, the vehicle OB) at a short distance (for example, several tens of centimeters), the distance to the measured object can be calculated even more accurately.

Although a construction that raises the resolution of the pulse width of the detection signal $S_d$ by delaying the detection signal $S_d$ has been described above, it is also possible to construct a radar apparatus 31 that uses a pulse width calculating unit 32 (see FIG. 12) that raises the resolution of the pulse width of the detection signal $S_d$ by delaying the internal clock CLK.

Aside from using the pulse width calculating unit 32 in place of the pulse width calculating unit 16, the radar apparatus 31 (a "second radar apparatus" for the present invention) has the same construction as the radar apparatus 1 shown in FIG. 1. For this reason, component parts that are the same as in the radar apparatus 1 have been assigned the same reference numerals and duplicated description thereof has been omitted. The description will instead focus on the difference with the radar apparatus 1, that is, the pulse width calculating unit 32.

Figure 12:
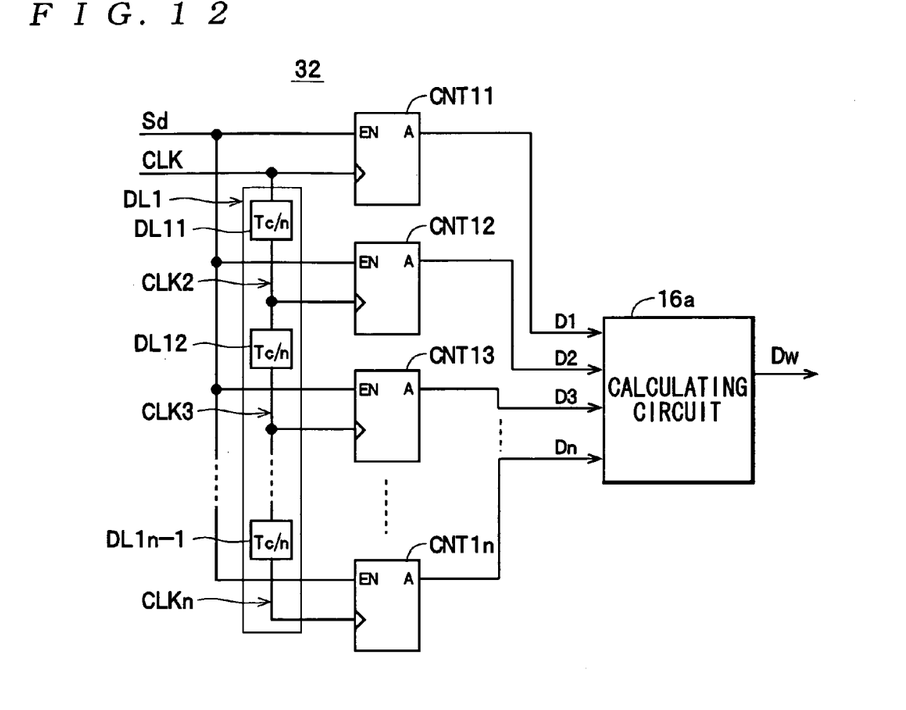
FIG. 12 is a block diagram showing the construction of a pulse width calculating unit of a second radar apparatus.

As shown in FIG. 12, the pulse width calculating unit 32 includes a delay circuit DL1, n counter circuits CNT11 to CNT1n, and a calculating circuit 16a, and calculates the pulse width Tw of the inputted detection signal $S_d$. It should be noted that component parts that are the same as in the pulse width calculating unit 16 have been assigned the same reference numerals and duplicated description thereof has been omitted. The delay circuit DL1 outputs (n−1) delayed internal clocks CLK2 to CLKn that are the internal clock CLK inputted from the delay element DL11 after the internal clock CLK has been delayed by Tc/(2×n), 2×Tc/(2×n), . . . , (n−1)×Tc/(2×n), respectively. The counter circuits CNT11 to CNT1n respectively receive an input of the detection signal $S_d$ via the respective enable terminals. The respective counter circuits CNT11 to CNT1n also input the internal clock CLK or a delayed internal clock (one of CLK2, CLK3, . . . , CLKn) via clock terminals. With this construction, the respective counter circuits CNT11 to CNT1n carry out count operations in synchronization with rising edges of the internal clock CLK or the delayed internal clocks CLK2, CLK3, . . . , CLKn while the detection signal $S_d$ is being inputted and respectively output count values D1 to Dn in accordance with the pulse width of the detection signal $S_d$.

Next, the operation of the pulse width calculating unit 32 will be described. It should be noted that an example will be described where n=4, that is, the pulse width calculating unit 32 includes four counter circuits CNT11 to CNT14 and three delay elements DL11 to DL13.

Figure 13:
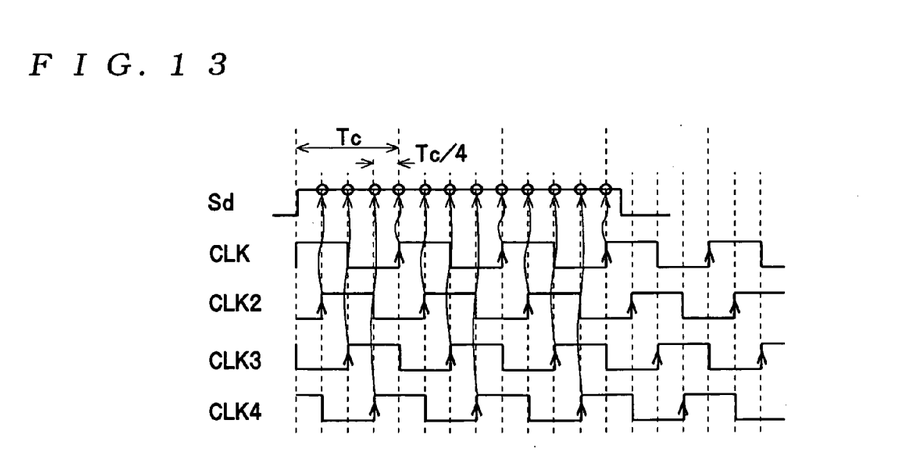
FIG. 13 is a timing chart useful in explaining the operation of the pulse width calculating unit shown in FIG. 12.

As shown in FIG. 13, in the pulse width calculating unit 32, the phases of the internal clock CLK and the delayed internal clocks CLK2, CLK3, and CLK4 supplied to the respective counter circuits CNT11 to CNT14 are respectively shifted by Tc/4. This results in the equivalent state to when the frequency of the internal clock has been quadrupled. Accordingly, the calculating circuit 16a calculates the sum Dsum of the count values D1, D2, . . . , D4 of the respective counter circuits CNT11 to CNT14 and multiplies the sum Dsum by Tc/n to calculate the pulse width Tw of the detection signal $S_d$, so that the pulse width Tw of the detection signal $S_d$ can be calculated at a high resolution of Tc/4 (the difference in phase between the internal clock CLK and the respective delayed internal clocks CLK2, CLK3, and CLK4). In addition, the calculating circuit 16a adds ½ the time (=Tc/8) of the phase difference (the delay time Tc/4 of the delay elements DL11 to DL13) to the value produced by multiplying the sum Dsum by Tc/n so that the pulse width Tw of the detection signal $S_d$ can be calculated with an error of ±Tc/8.

Figure 14:
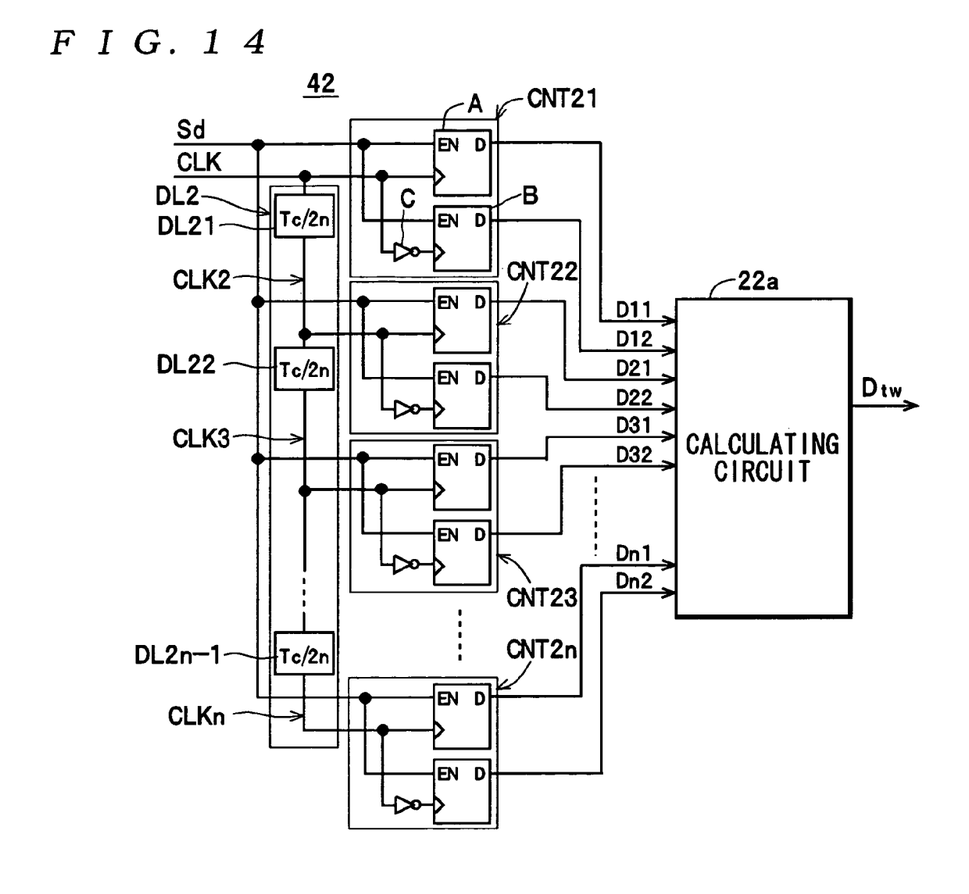
FIG. 14 is a block diagram showing the construction of a pulse width calculating unit of a fourth radar apparatus.

Also, by using a construction that delays the internal clock CLK for the pulse width calculating unit 22, it is possible to construct a pulse width calculating unit 42 shown in FIG. 14 and to also construct a radar apparatus 41 (see FIG. 1) using the pulse width calculating unit 42. Aside from using the pulse width calculating unit 42 in place of the pulse width calculating unit 16, the radar apparatus 41 (a "fourth radar apparatus" for the present invention) has the same construction as the radar apparatus 1. For this reason, component parts that are the same have been assigned the same reference numerals, duplicated description thereof has been omitted, and only the pulse width calculating unit 42 that is different will be described. The pulse width calculating unit 42 includes a delay circuit DL2, n counter circuits CNT21 to CNT2n, and a calculating circuit 22a. It should be noted that component parts that are the same as in the pulse width calculating unit 22 have been assigned the same reference numerals and duplicated description thereof has been omitted. The delay circuit DL2 outputs (n−1) delayed internal clocks CLK2 to CLKn that are the internal clock CLK inputted from the delay element DL21 side after the internal clock CLK has been delayed by Tc/(2×n), 2×Tc/(2×n), . . . , (n−1)×Tc/(2×n), respectively. The respective counters A of the counter circuits CNT21 to CNT2n receive an input of the detection signal $S_d$ via enable terminals and receive a direct input of the internal clock CLK or a delayed internal clock (one of CLK2 to CLKn) via clock terminals, and carry out count operations in synchronization with one edge (as one example, rising edges) of the respective clocks while the detection signal $S_d$ is being inputted. By doing so, the respective counters A of the counter circuits CNT21 to CNT2n output count values (D11, D21, . . . , Dn1) showing the pulse width of the detection signal $S_d$. On the other hand, the respective counters B of the counter circuits CNT21 to CNT2n receive an input of the detection signal $S_d$ via enable terminals and receive an input of the internal clock CLK or a delayed internal clock (one of CLK2 to CLKn) that has been inverted by the inverters C via clock terminals. By doing so, the counters B carry out count operations in synchronization with the other edge (as one example, falling edges) of the internal clock CLK or the delayed internal clock (one of CLK2 to CLKn) while the detection signal $S_d$ is being inputted, and output count values (D12, D22, . . . , Dn2) showing the pulse width of the detection signal $S_d$. The calculating circuit 22a calculates the sum Dsum of the count values D11, D12, D21, D22, . . . , Dn1, Dn2, multiplies the calculated sum Dsum by Tc/(2×n), and adds Tc/4×n) to the multiplication result. By doing so, the calculating circuit 22a calculates the pulse width Tw of the detection signal $S_d$. The calculating circuit 22a outputs the pulse width data Dtw showing the calculated pulse width Tw.

Figure 15:
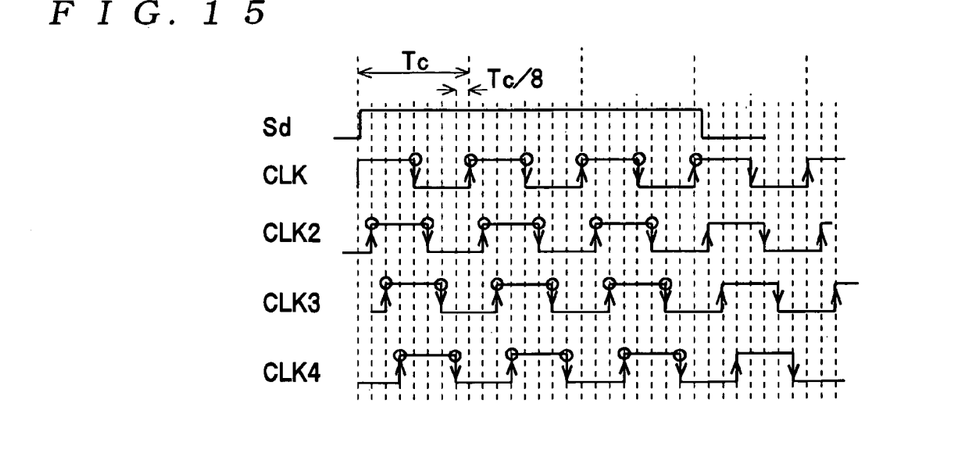
FIG. 15 is a timing chart useful in explaining the operation of the pulse width calculating unit shown in FIG. 14.

With the above construction, as shown in FIG. 15 (which shows the example case where n=4), the pulse width calculating unit 42 is constructed so that the rising edges and falling edges of the internal clock CLK and the delayed internal clocks CLK2 to CLKn supplied to the counter circuits CNT21 to CNT2n are each shifted by Tc/(2×n). This results in the equivalent state to when the frequency of the internal clock has been quadrupled. Accordingly, the pulse width calculating unit 42 can calculate the pulse width Tw of the detection signal $S_d$ with a high resolution of Tc/(2×n) (the difference in phase between the internal clock CLK and the respective delayed internal clocks CLK2, CLK3, and CLK4). Additionally, by adding half (=Tc/(4×n)) the time equivalent to this phase difference (the delay time (=Tc/(2×n) of the delay elements DL21 to DL2n−1), the calculating circuit 22a can calculate the pulse width Tw of the detection signal $S_d$ with an error of ±Tc/(4×n)

Figure 16:
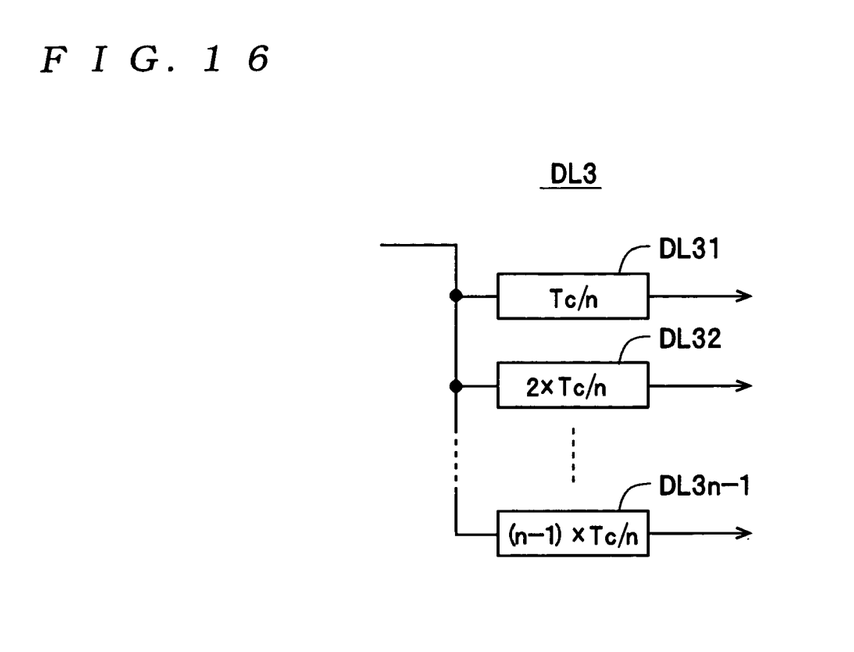
FIG. 16 is a block diagram showing the construction of another delay circuit.
Figure 17:
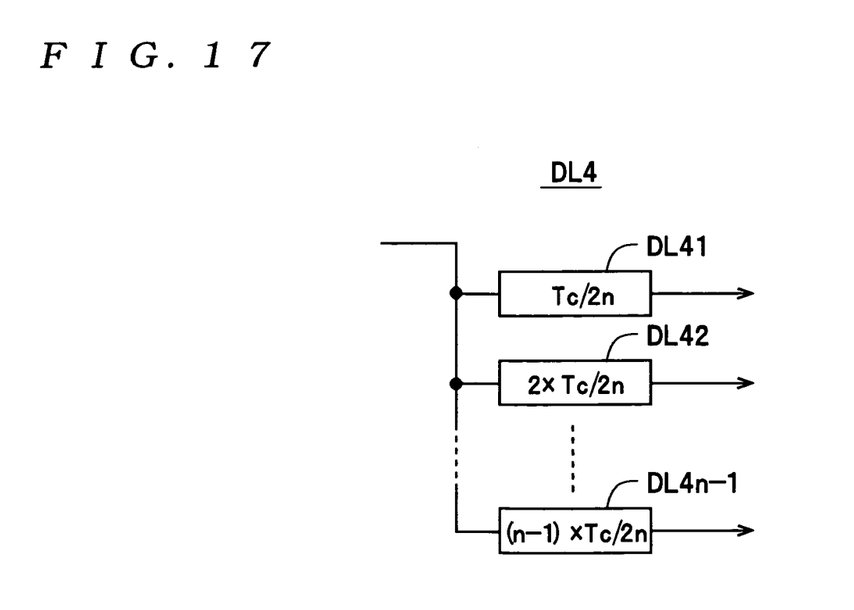
FIG. 17 is a block diagram showing the construction of another delay circuit.

It should be noted that the present invention is not limited to the constructions described above. For example, although examples have been described where the respective pulse width calculating units 16, 32 use the delay circuit DL1 in which a plurality of delay elements DL11 to DL1n−1 set with the same delay time (Tc/n) are connected in series, in place of the delay circuit DL1, as shown in FIG. 16 for example, it is possible to use a delay circuit DL3 including (n−1) delay elements DL31, DL32, . . . , DL3n−1 whose respective delay times are set at Tc/n, 2×Tc/n, . . . , (n−1)×Tc/n, with the delay elements DL31 to DL3n−1 directly delaying signals inputted from the outside and outputting delayed signals to the respective counter circuits CNT12 to CNT1n. In the same way, although examples have been described where the respective pulse width calculating units 22, 42 use the delay circuit DL2 in which a plurality of delay elements DL21 to DL2n–1 set with the same delay time (Tc/(2×n)) are connected in series, in place of the delay circuit DL2, as shown in FIG. 17 for example, it is possible to use a delay circuit DL4 including (n–1) delay elements DL41, DL42, ..., DL4n–1 whose respective delay times are set at Tc/(2×n), 2×Tc/(2×n), ..., (n–1)×Tc/(2×n), with the delay elements DL41 to DL4n–1 directly delaying signals inputted from the outside and outputting delayed signals to the respective counter circuits CNT22 to CNT2n. Also, although examples where n=4 have been described for the respective pulse width calculating units 16, 22, 32, and 42, n may be any natural number of two or greater. Accordingly, n may be set at three, and by setting n at five or above, the resolution of the calculation of the pulse width Tw can be raised further. Also, although the respective pulse width calculating units 16, 22, 32, and 42 have been described above by way of examples that use counter circuits that carry out count operations in synchronization with rising edges of the clocks, it is also possible to use counter circuits that carry out count operations in synchronization with falling edges of the clocks.

Also, although a construction has been described where the pulse generating unit 2 directly sends the trigger signal $S_{TG}$ to the detection signal generating unit 15, the present invention is not limited to this. As one example, a high frequency signal $S_{TR}$ modulated using the baseband signal $S_{TB}$ may be outputted directly to the reception antenna 11 or the mixer unit 12 without passing the vehicle OB, and the detection signal generating unit 15 may generate the detection signal $S_d$ based on a first baseband signal $S_{RB}$ (the "trigger signal" for the present invention) generated by the mixer unit 12 from the directly outputted high frequency signal $S_{TR}$ and the second baseband signal $S_{RB}$ (the "modulation signal" for the present invention) generated from the high frequency signal $S_{TR}$ reflected by the vehicle OB.

What is claimed is:

1. A radar apparatus comprising:
   a modulation signal generating unit that generates a modulation signal with a predetermined pulse width based on an internal clock with a cycle Tc and generates a trigger signal in synchronization with the modulation signal;
   a carrier wave generating unit that generates a carrier wave;
   a modulation unit that generates a high frequency signal by modulating the carrier wave using the modulation signal that has been inputted and outputs the high frequency signal;
   a modulation signal extracting unit that extracts the modulation signal from a component of the high frequency signal that has been transmitted via a transmission antenna, the component having been reflected by a measured object and received by a reception antenna;
   a detection signal generating unit that generates a detection signal, which can be used to measure a distance to the measured object, based on the trigger signal and the modulation signal extracted by the modulation signal extracting unit; and
   a pulse width calculating unit that calculates a pulse width of the detection signal, wherein the pulse width calculating unit comprises:
      a delay circuit that generates (n–1) delayed detection signals by delaying the detection signal that has been inputted by Tc/n, 2×Tc/n, ..., (n–1)×Tc/n, where n is a natural number of 2 or greater;
      n counter circuits that respectively carry out count operations in synchronization with rising edges or falling edges of the internal clock while the detection signal and the respective delayed detection signals are being inputted; and
      a calculating circuit that calculates a sum of count values of the respective counter circuits and multiplies the sum by Tc/n and adds Tc/(2×n) to a result of multiplying the sum to calculate the pulse width of the detection signal.

2. A radar apparatus comprising:
   a modulation signal generating unit that generates a modulation signal with a predetermined pulse width based on an internal clock with a cycle Tc and generates a trigger signal in synchronization with the modulation signal;
   a carrier wave generating unit that generates a carrier wave;
   a modulation unit that generates a high frequency signal by modulating the carrier wave using the modulation signal that has been inputted and outputs the high frequency signal;
   a modulation signal extracting unit that extracts the modulation signal from a component of the high frequency signal that has been transmitted via a transmission antenna, the component having been reflected by a measured object and received by a reception antenna;
   a detection signal generating unit that generates a detection signal, which can be used to measure a distance to the measured object, based on the trigger signal and the modulation signal extracted by the modulation signal extracting unit; and
   a pulse width calculating unit that calculates a pulse width of the detection signal, wherein the pulse width calculating unit comprises:
      a delay circuit that generates (n–i) delayed internal clocks by delaying the internal clock that has been inputted by Tc/n, 2×Tc/n, ..., (n–1)×Tc/n, where n is a natural number of 2 or greater;
      n counter circuits that respectively carry out count operations in synchronization with rising edges or falling edges of the internal clock and the respective delayed internal clocks while the detection signal is being inputted; and
   a calculating circuit that calculates a sum of count values of the respective counter circuits and multiplies the sum by Tc/n and adds Tc/(2×n) to a result of multiplying the sum to calculate the pulse width of the detection signal.

3. A radar apparatus comprising:
   a modulation signal generating unit that generates a modulation signal with a predetermined pulse width based on an internal clock with a cycle Tc and generates a trigger signal in synchronization with the modulation signal;
   a carrier wave generating unit that generates a carrier wave;
   a modulation unit that generates a high frequency signal by modulating the carrier wave using the modulation signal that has been inputted and outputs the high frequency signal;
   a modulation signal extracting unit that extracts the modulation signal from a component of the high frequency signal that has been transmitted via a transmission antenna, the component having been reflected by a measured object and received by a reception antenna;
   a detection signal generating unit that generates a detection signal, which can be used to measure a distance to the measured object, based on the trigger signal and the modulation signal extracted by the modulation signal extracting unit; and a pulse width calculating unit that calculates a pulse width of the detection signal, wherein the pulse width calculating unit comprises:

a delay circuit that generates (n−1) delayed detection signals by delaying the detection signal that has been inputted by $Tc/(2\times n)$, $2\times Tc/(2\times n)$, . . . , $(n-1)\times Tc/(2\times n)$, where n is a natural number of 2 or greater;

n counter circuits that respectively carry out count operations in synchronization with rising edges and falling edges of the internal clock while the detection signal and the respective delayed detection signals are being inputted; and     a calculating circuit that calculates a sum of count values of the respective counter circuits and multiplies the sum by $Tc/(2\times n)$ and adds $Tc/(4\times n)$ to a result of multiplying the sum to calculate the pulse width of the detection signal.

4. A radar apparatus comprising:

a modulation signal generating unit that generates a modulation signal with a predetermined pulse width based on an internal clock with a cycle Tc and generates a trigger signal in synchronization with the modulation signal;

a carrier wave generating unit that generates a carrier wave;

a modulation unit that generates a high frequency signal by modulating the carrier wave using the modulation signal that has been inputted and outputs the high frequency signal;

a modulation signal extracting unit that extracts the modulation signal from a component of the high frequency signal that has been transmitted via a transmission antenna, the component having been reflected by a measured object and received by a reception antenna;

a detection signal generating unit that generates a detection signal, which can be used to measure a distance to the measured object, based on the trigger signal and the modulation signal extracted by the modulation signal extracting unit; and a pulse width calculating unit that calculates a pulse width of the detection signal, wherein the pulse width calculating unit comprises:

a delay circuit that generates (n−1) delayed internal clocks by delaying the internal clock that has been inputted by $Tc/(2\times n)$, $2\times Tc/(2\times n)$, . . . , $(n-1)\times Tc/(2\times n)$, where n is a natural number of 2 or greater;

n counter circuits that respectively carry out count operations in synchronization with rising edges and falling edges of the internal clock and the respective delayed internal clocks while the detection signal is being inputted; and a calculating circuit that calculates a sum of count values of the respective counter circuits and multiplies the sum by $Tc/(2\times n)$ and adds $Tc/(4\times n)$ to a result of multiplying the sum to calculate the pulse width of the detection signal.

\* \* \* \* \*